(12) United States Patent
Miyairi et al.

(10) Patent No.: US 9,539,671 B2
(45) Date of Patent: Jan. 10, 2017

(54) PRECIOUS METAL PASTE FOR BONDING SEMICONDUCTOR ELEMENT

(75) Inventors: Masayuki Miyairi, Hiratsuka (JP); Nobuyuki Akiyama, Hiratsuka (JP); Katsuji Inagaki, Hiratsuka (JP); Toshinori Ogashiwa, Hiratsuka (JP)

(73) Assignee: Tanaka Kikinzoku K.K., Tokyo (JP)

( * ) Notice: Subject to any disclaimer, the term of this patent is extended or adjusted under 35 U.S.C. 154(b) by 0 days.

(21) Appl. No.: 13/822,334

(22) PCT Filed: Sep. 30, 2011

(86) PCT No.: PCT/JP2011/072512
§ 371 (c)(1),
(2), (4) Date: Mar. 12, 2013

(87) PCT Pub. No.: WO2012/046641
PCT Pub. Date: Apr. 12, 2012

(65) Prior Publication Data
US 2013/0168437 A1    Jul. 4, 2013

(30) Foreign Application Priority Data
Oct. 8, 2010   (JP) ................. 2010-228279

(51) Int. Cl.
H01L 21/30      (2006.01)
B23K 35/30      (2006.01)
H01L 23/00      (2006.01)

(52) U.S. Cl.
CPC ....... *B23K 35/3006* (2013.01); *B23K 35/3013* (2013.01); *H01L 24/29* (2013.01);
(Continued)

(58) Field of Classification Search
CPC ............................. H01L 2/00; H01L 2924/001
(Continued)

(56) References Cited
U.S. PATENT DOCUMENTS 5,433,893 A * 7/1995 Jost et al. ............. 252/514
5,966,580 A * 10/1999 Watanabe et al. ........ 419/9
(Continued)

FOREIGN PATENT DOCUMENTS

JP    2001-181482    7/2001
JP    2004-359830    12/2004
(Continued)

OTHER PUBLICATIONS

EP11830573.9 Supplementary Search Report, Jun. 28, 2016, Tanaka Kikinzoku Kogyo K.K.
(Continued)

*Primary Examiner* — Jie Yang
(74) *Attorney, Agent, or Firm* — Roberts & Roberts, LLP

(57) ABSTRACT

A precious metal paste which does not cause contamination of a member, which can be uniformly coated to a member to be bonded, and which is in good condition after bonding is provided. The present invention relates to a precious metal paste for bonding a semiconductor element, of the paste including a precious metal powder and an organic solvent, in which the precious metal powder has a purity of 99.9 mass % or more and an average particle diameter of 0.1 to 0.5 μm, the organic solvent has a boiling point of 200 to 350° C., and a thixotropy index (TI) value calculated from a measurement value of a viscosity at a shear rate of 4/s with respect to a viscosity at a shear rate of 40/s at 23° C. by means of a rotational viscometer is 6.0 or more.

11 Claims, 1 Drawing Sheet

(52) U.S. Cl.
CPC .... *H01L 24/83* (2013.01); *H01L 2224/04026* (2013.01); *H01L 2224/05166* (2013.01); *H01L 2224/05644* (2013.01); *H01L 2224/29101* (2013.01); *H01L 2224/29294* (2013.01); *H01L 2224/29339* (2013.01); *H01L 2224/29344* (2013.01); *H01L 2224/8384* (2013.01); *H01L 2224/83203* (2013.01); *H01L 2924/00011* (2013.01); *H01L 2924/00013* (2013.01); *H01L 2924/01004* (2013.01); *H01L 2924/014* (2013.01); *H01L 2924/01006* (2013.01); *H01L 2924/01023* (2013.01); *H01L 2924/01033* (2013.01); *H01L 2924/01047* (2013.01); *H01L 2924/01079* (2013.01); *H01L 2924/0665* (2013.01); *H01L 2924/10253* (2013.01); *H01L 2924/351* (2013.01)

(58) Field of Classification Search
USPC .......................................................... 148/22
See application file for complete search history.

(56) References Cited

U.S. PATENT DOCUMENTS

| | | | | |
|---|---|---|---|---|
| 7,789,287 B2* | 9/2010 | Ogashiwa et al. | ......... | 228/110.1 |
| 8,193,707 B2* | 6/2012 | Matsuno | .................. | H01B 1/22 313/583 |
| 8,505,804 B2* | 8/2013 | Ogashiwa et al. | ......... | 228/124.6 |
| 8,821,768 B2* | 9/2014 | Yasuda et al. | ............. | 252/520.3 |
| 2007/0290369 A1* | 12/2007 | Hasegawa et al. | ........... | 257/783 |
| 2009/0309459 A1 | 12/2009 | Ogashiwa et al. | ............ | 310/348 |

FOREIGN PATENT DOCUMENTS

| | | |
|---|---|---|
| JP | 2005-216508 A | 1/2005 |
| JP | 2007-019144 A | 1/2007 |
| JP | 2007-324523 | 12/2007 |
| JP | 2008-028364 | 2/2008 |
| JP | 2009-102603 A | 5/2009 |

OTHER PUBLICATIONS

EPO Patent Abstracts of Japan, Publ.No. 2009102603, Publ.Date May 14, 2009.
EPO Patent Abstacts of Japan, Publ.No. 2007-019144, Publ.Date Jan. 25, 2007.
EPO Patent Abstacts of Japan, Publ.No. 2005-216508, Publ.Date Aug. 11, 2005.

* cited by examiner

PRECIOUS METAL PASTE FOR BONDING SEMICONDUCTOR ELEMENT

BACKGROUND OF THE INVENTION

Field of the Invention

The present invention relates to a precious metal paste suitable for bonding a substrate and a semiconductor element.

Description of the Related Art

A brazing material is widely used for bonding of various members, such as die bonding of a semiconductor element to a substrate, and an AuSn-based brazing material which is a fluxless brazing material is generally used. In the case where various members are bonded by using a brazing material, a method in which, after arranging a pair of members to be bonded with a brazing material sandwiched therebetween, the brazing material is fused by heating to a temperature equal to or higher than a melting point (about 300° C. or higher) at which the brazing material is molten is known. However, a problem sometimes occurred, in which, when heating to such a high temperature, electrical properties are varied in a member such as a semiconductor element due to a thermal stress applied to the member after bonding.

For this reason, a material which can bond members by heating to as low a temperature as possible is desired instead of a brazing material. As such a material, for example, Patent Literature 1 discloses a silver paste containing a silver powder and an epoxy resin and capable of bonding at a relatively-low temperature such as 100 to 200° C. In addition, the present inventors provide, in Patent Literature 2, a gold paste containing a gold powder having a predetermined purity and particle diameter and an organic solvent.

PRIOR ART DOCUMENTS

Patent Literature

Patent Literature 1: Japanese Patent Appl. Laid-Open No. 2004-359830
Patent Literature 2: Japanese Patent Appl. Laid-Open No. 2007-324523

SUMMARY OF THE INVENTION

Problems to be Solved by the Invention

However, in the paste containing a resin as disclosed in Patent Literature 1 above, the resin was not completely decomposed by heating in bonding, and sometimes the resin remained on the member after bonding. Thus, in a member such as a semiconductor chip, the remained resin as a cause of contamination sometimes influenced semiconductor performance and the like. In this regard, the paste of Patent Literature 2 can have a structure not containing a resin. However, in this case, it was difficult for the paste to be uniformly coated because aggregation of the precious metal particle tends to be relatively easy to proceed when coating the paste and the organic solvent sometimes bleeds from the coated paste. Furthermore, in the paste containing an organic solvent as disclosed in Patent Literature 2, when sintering the gold by heating the paste after coating, a void was sometimes generated in a sintered compact due to volatilization or the like of the organic solvent.

In view of this, it is an object of the present invention to provide a precious metal paste which does not cause contamination of a member after bonding, which can be uniformly coated to a member to be bonded, and whose sintered compact after sintering the precious metal by heating in bonding is in good condition.

Means for Solving the Problems

In order to solve the above problem, the present inventors studied a precious metal paste which can be uniformly coated to a member to be bonded without using various resins and the like which can be a cause of contamination after bonding. As a result, the following precious metal paste of the present invention was conceived.

That is, the present invention relates to a precious metal paste for bonding a semiconductor element, the paste comprising a precious metal powder and an organic solvent, in which the precious metal powder has a purity of 99.9 mass % or more and an average particle diameter of 0.1 to 0.5 μm, the organic solvent has a boiling point of 200 to 350° C., and the precious metal paste has a thixotropy index (TI) value of 6.0 or more, which is calculated from a measurement value of a viscosity at a shear rate of 4/s with respect to a viscosity at a shear rate of 40/s at 23° C. by means of a rotational viscometer. The precious metal paste of the present invention does not contain various resins which can be a cause of contamination of a member to be bonded, has excellent wettability and can be uniformly coated to the member to be bonded. Moreover, according to the precious metal paste of the present invention, since dispersibility of the precious metal particle after coating can be uniformly maintained, outgassing by volatilization and decomposition of the organic constituent can be uniformly released when heating in bonding, and the generation of a void can be suppressed.

Here, the "TI (thixotropy index) value" defined for the paste of the present invention will be described. Generally, for a paste of a precious metal or the like, a viscosity tends to decrease as a shear rate applied to the paste in measurement increases. Under the circumstance, the TI value is calculated by means of viscosity values measured at two rotational rates having different shear rates, as a viscosity ratio between the two. Thus, the TI value is a value indicating viscosity change with respect to the shear rates, that is, an index indicating how high a thixotropy nature is.

The precious metal paste of the present invention has a TI value of 6.0 or more, and the thixotropy nature is moderately high. Therefore, moldability can be maintained when coating the paste, and furthermore, sintering of the precious metal by heating in bonding can uniformly proceed, and thus, the sintered compact after sintering can be densified. With these advantages, the precious metal paste of the present invention becomes especially suitable for die bonding which performs large-area coating. In the case where the TI value is less than 6.0, when the precious metal paste is coated to the member to be bonded, the solvent sometimes bleeds (bleedout). In addition, the upper limit of the TI value is preferably equal to or less than 20. In the case where it exceeds 20, it tends to become difficult to handle the precious metal paste in kneading before coating of the precious metal paste.

A viscosity at a shear rate of 4/s, which is a precondition for calculating the TI value, is preferably 100 to 1000 Pa·s. If it is less than 100 Pa·s, the precious metal powder tends to settle out and separate from the solvent. If it exceeds 1000 Pa·s, handling ability is likely to decrease. Hereinafter, the precious metal paste in the present invention will be described in detail.

Firstly, the organic solvent constituting the precious metal paste of the present invention will be described. The organic solvent in the present invention has a boiling point of 200 to 350° C. (under atmospheric pressure). If the boiling point of the organic solvent is less than 200° C., when heating in bonding, an evaporation rate of the organic solvent becomes high and aggregation control of the precious metal particle becomes difficult, and furthermore, the organic solvent is evaporated even at ordinary temperature according to circumstances, and thus, handling in coating of the paste becomes difficult. On the other hand, if the boiling point of the organic solvent exceeds 350° C., the organic solvent sometimes remains on the member after bonding. As the organic solvent, one, or two or more organic solvents can be contained as far as their boiling points are within the above range. The "boiling point of 200 to 350° C." for the organic solvent of the present invention means that all of contained organic solvents each have a boiling point within the range of 200 to 350° C. in the case of containing two or more organic solvents.

As the organic solvent utilizable in the present invention, branched-chain saturated aliphatic dihydroxy alcohols and monoterpene alcohols are preferable. As the branched-chain saturated aliphatic dihydroxy alcohols, propylene glycol, 1,2-butanediol, 1,3-butanediol, 1,2-pentanediol, 1,3-pentanediol, 1,4-pentanediol, 1,5-pentanediol, 2,3-pentanediol, 2,4-pentanediol, 1,2-hexanediol, 1,3-hexanediol, 1,4-hexanediol, 1,5-hexanediol, 1,6-hexanediol, and derivatives thereof are used. As the monoterpene alcohols, citronellol, geraniol, nerol, menthol, terpineol, carveol, thujyl alcohol, pinocampheol, β-fenchyl alcohol, dimethyloctanol, hydroxycitronellol, and derivatives thereof are used.

In view of the boiling point of the solvent, a carbon number of the above organic solvent is preferably 5 to 20. In particular, in the case of being made of one organic solvent, a saturated aliphatic dihydroxy alcohol having a carbon number of 5 to 20 is preferably used, and 2,4-dimethyl-1,5-pentanediol (product name of NKY MARS; The Nippon Koryo Yakuhin Kaisha, Ltd., hereinafter, referred to as MARS) is especially suitable. In the case of being made of two organic solvents, a monocyclic monoterpene alcohol and a bicyclic monoterpene alcohol each having a carbon number of 5 to 20 are preferably mixed to be used, and a material made by mixing isohornylcyclohexanol (product name of Tersorb MTPH; Nippon Terpene Chemicals, Inc., hereinafter, referred to as MTPH) and a-terpineol at a rate of 1/1 to 3/1 in a mass ratio is especially suitable.

Next, the precious metal powder constituting the paste of the present invention will be described. As the precious metal powder, a gold powder or a silver powder, or a mixed powder thereof may be used. In view of the electrical and thermal conductivity, using only the gold powder is especially suitable.

The reason why a high purity of 99.9 mass % or more is required as a purity of the precious metal powder is because, if the purity is low, a sintering behavior of the Au particle becomes unstable and stability of bonding strength decreases, and the member to be bonded after bonding becomes hard and a crack becomes easy to be generated due to thermal shock or the like. In addition, the average particle diameter of the precious metal powder is set to be 0.1 to 0.5 µm. If the precious metal powder has the particle diameter of more than 0.5 µm, the precious metal powder becomes difficult to maintain a dispersion state in the paste and tends to settle out. Moreover, after sintering the precious metal powder by heating in bonding, a favorable adjacent state between the precious metal powders is difficult to be produced. On the other hand, if the average particle diameter is less than 0.1 µm, aggregation of the precious metal powder sometimes occurs.

A content of the precious metal powder in the paste is preferably within the range of 26 to 66 vol. % (v/v) in a volume content (volume of the precious metal powder/total volume of the precious metal paste). With such a volume content, the precious metal paste tends to have a TI value of 6.0 or more. Moreover, the sintered compact after bonding tends to be dense, and high adhesion bonding can be achieved. If the content of the precious metal powder is less than 26 vol. %, it becomes difficult to obtain the effect of increasing adhesion, and the paste becomes difficult to be kneaded. On the other hand, if it exceeds 66 vol. %, aggregation of the precious metal powder sometimes occurs. The content of the precious metal powder is more preferably 35 to 55 vol. % (v/v).

The precious metal paste made of the above-described precious metal powder and organic solvent can further contain 0.05 to 1 mass % of a surfactant. In the case of containing the surfactant, a state in which the precious metal powder is uniformly dispersed in the precious metal paste becomes easy to be maintained. If the content of the surfactant is less than 0.05 mass %, the aggregation-suppressing effect of the precious metal powder is low, and if it exceeds 1 mass %, the surfactant sometimes remains on the member after bonding. As the surfactant, a cationic surfactant is preferable, and for example, a quaternary ammonium salt type, such as a dodecyltrimethylammonium salt, a hexadecyltrimethylammonium salt, an octadecyltrimethylammonium salt, a dodecyldimethylammonium salt, an octadecenyldimethylethylammonium salt, a dodecyldimethylbenzylammonium salt, a hexadecyldimethylbenzylammonium salt, an octadecyldimethylbenzylammonium salt, a trimethylbenzylammonium salt, and a triethylbenzylammonium salt, an alkylamine salt type, such as an octadecylamine salt, a stearylamine salt, and an N-alkylalkylenediamine salt, and a pyridinium salt type, such as a hexadecylpyridinium salt and a dodecylpyridinium salt, are used. Among them, alkyl(C8-C18)amine acetate (product name: Armac C) and N-alkyl(C14-C18)trimethylenediamine oleate (product name: Duomeen TDO) are especially suitable. A polymer type surfactant is not suitable in the present invention because it requires a high temperature for decomposition.

Advantageous Effects of Invention

As described above, according to the precious metal paste of the present invention, contamination or the like of a member after bonding does not occur, the paste can be uniformly coated to various members to be bonded, and sintering by heating in bonding can uniformly proceed.

DETAILED DESCRIPTION OF THE PREFERRED EMBODIMENTS

Figure 1:
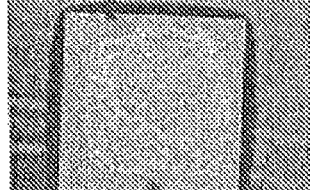
FIG. 1 shows an appearance X-ray fluoroscopic image of a bonded part and a result of a cross-sectional observation by an electron microscope (SEM).

Hereinafter, suitable embodiments of the present invention will be described.

EXAMPLE 1

A gold paste was prepared by mixing 95 mass % of a gold powder (average particle diameter: 0.3 µm) having a purity of 99.99 mass % manufactured by a wet reduction method, 3.75 mass % of isobornylcyclohexanol (MTPH) as an organic solvent, and 1.25 mass % of α-terpineol. A volume content of the gold powder in the gold paste was 49.6 vol. %. With respect to the used organic solvent and the obtained gold paste, the following physical property measurement was performed.

Physical Property Measurement

With a cone rotational viscometer (Rheostress RS75 manufactured by HAAKE, measured with cone plate made of titanium, having a diameter of 35 mm, φ of 1°, a gap of 0.050 mm), a viscosity of each of the organic solvent and the gold paste was continuously measured by being maintained for 30 seconds at respective shear rates of 4/s, 20/s, and 40/s in this order, after being maintained for 30 seconds at a shear rate of 0/s, at a measurement temperature of 23° C. The boiling point of the organic solvent was measured in atmosphere at a temperature increase rate of 10° C./min by TG-DTA (simultaneous thermogravimetric/differential thermal analysis: TG8101D manufactured by Rigaku Corporation). Moreover, the thixotropy index (TI) value was calculated from the viscosity measurement values at the shear rates of 4/s and 40/s in accordance with the following equation. Furthermore, with respect to the gold paste of Example 1, the TG-DTA (simultaneous thermogravimetric/differential thermal analysis) was performed.

TI=(the viscosity at the shear rate of 4/s)/(the viscosity at the shear rate of 40/s)

According to the above result, the viscosity of the gold paste of Example 1 at the shear rate of 4/s was 256 Pa·s. Moreover, according to the TG-DTA, it was confirmed that evaporation of the organic solvent starts at 70° C. and the organic constituent completely disappears at 190° C. in the gold paste of Example 1.

EXAMPLES 2 to 5, Comparative Examples 1 to 7

Gold pastes were produced by using the same gold powder as in Example 1 with the use of the organic solvents and gold contents shown in Table 1. In Example 2, a gold powder having the average diameter of 0.1 μm was used. In Comparative Example 7, bisalkenylsuccinimide (manufactured by King Industries Inc., product name: KX1223C) was used as the organic solvent. In each of Examples and Comparative Examples, the viscosity and the boiling point of the organic solvent, and the viscosity and the TI value of the gold paste were measured by the same methods as in Example 1. The results are shown in Table 1.

According to the above results of the physical property measurement, each of the precious metal pastes of Examples 1 to 5 was shown to have a TI value of 6.0 or more. In contrast, each of the TI values in Comparative Examples 1 to 3, 5, and 7 was less than 6.0. Furthermore, a paste was not able to be obtained in each of Comparative Examples 4 and 6 because, even if the gold powder and the organic solvent were mixed, the precious metal powder settled out immediately and separated from the solvent or handling became difficult.

[Average Particle Diameter of Gold Powder]

In addition to the above Examples and Comparative Examples, gold pastes were produced as in Example 1 by using, as the gold powder, a gold powder having an average particle diameter of 0.7 μm and a gold powder having an average particle diameter of 0.05 μm. As a result, in the case of the gold powder having an average particle diameter of 0.7 μm, dispersion of the gold powder failed to be maintained in the paste and settling occurred, and in the case of the gold powder having an average particle diameter of 0.05 μm, partial aggregation was confirmed in the paste.

[Silver Paste]

Furthermore, a silver paste was produced as in Example 1 by using a silver powder (86 wt. %; 37 vol. %) instead of the gold powder, and the physical property measurement was performed. As a result, in the obtained silver paste, the viscosity at the shear rate of 4/s was 176 Pa·s, the viscosity at the shear rate of 40/s was 19 Pa·s, and the TI value was 9.3.

Coating Test for Substrate

Next, the gold paste of each of the above Examples 1 to 5 and Comparative Examples 1 to 3, and 5 was coated to a center of a semiconductor substrate (Si) having an area of 100 mm$^2$ such that the area of the gold paste is 25 mm$^2$, and coating performance to the substrate was evaluated. In addition, as the substrate, a substrate having a film of Ti (50 nm) and Au (200 nm) formed on its surface in advance by sputtering was used.

TABLE 1

| | | | organic solvent[*2] | | paste viscosity (Pa · s) | | |
| --- | --- | --- | --- | --- | --- | --- | --- |
| | kind of organic solvent[*1] | gold content (vol. %) | viscosity (Pa · s) | boiling point (° C.) | Shear Rate 4 (/s) | Shear Rate 40 (/s) | TI value |
| Example 1 | M/T = 3/1 | 49.6 | 14.4 | 313/213 | 256 | 27 | 9.5 |
| Example 2 | M/T = 3/1 | 40.7 | 14.4 | 313/213 | 184 | 30 | 6.1 |
| Example 3 | MARS | 53.5 | 1.7 | 264 | 934 | 60 | 15.6 |
| Example 4 | MARS | 35.8 | 1.7 | 264 | 315 | 25 | 12.6 |
| Example 5 | MARS | 41.4 | 1.7 | 264 | 502 | 82 | 6.1 |
| Comparative Example 1 | M/T = 3/1 | 36.4 | 14.4 | 313/213 | 157 | 29 | 5.4 |
| Comparative Example 2 | MARS/T = 3/1 | 29.7 | 14.4 | 264/213 | 52 | 13 | 4.0 |
| Comparative Example 3 | M/T = 1/1 | 29.5 | 1.3 | 313/213 | 77 | 21 | 3.7 |
| Comparative Example 4 | M | 44.8 | 1702 | 313 | not obtain a paste | | |
| Comparative Example 5 | M | 35.8 | 1702 | 313 | 144 | 54 | 2.7 |
| Comparative Example 6 | T | 35.8 | 0.05 | 213 | not obtain a paste | | |
| Comparative Example 7 | KX1223C | 43.5 | 6.5 | 350-450 | 328 | 152 | 2.2 |

[*1]M represents MTPH, and T represents α-terpineol. M/T is a mixing ratio of MTPH to α-terpineol.
[*2]With respect to M/T, (boiling point of MTPH)/(boiling point of α-terpineol) is shown.

As a result, each of the gold pastes of Examples 1 to 5 had moderate wettability and was easy to be coated to the substrate, and the gold paste after coating also maintained sufficient moldability. On the other hand, in the gold paste of Comparative Example 3, the solvent tended to bleed from the coated gold paste, and the paste after coating was deformed.

Bonding Test

The following bonding test was performed after coating the paste as described above without drying and sintering. The bonding test was performed by placing a Si chip having an area of 4 mm$^2$ (on which a film of Ti (20 nm) and Au (200 nm) is formed in advance) on the paste after coating, and by heating and pressurizing it. In bonding, application of pressure was 20 N (5 MPa) per one chip and application of heat was set to be 230° C. by heat transferred from a tool, and heating and pressurizing time was set to be 10 minutes.

With respect to a bonded part which has been bonded as described above, a structure observation was performed by an appearance X-ray fluoroscopic image (manufactured by Uni-Hite System Corporation), and a bonding rate was calculated in accordance with the following equation. The results for the bonding rate are shown in Table 2. In addition, the X-ray fluoroscopic image of each of Example 1 and Comparative Example 1, and the result of a cross-sectional SEM observation of Example 1 are shown in FIG. 1. In the X-ray fluoroscopic image, a part in which a void is generated and a space is formed in the bonded part is observed as a white color, and a part in which tight adherence occurs in the bonded part is observed as a gray (black).

bonding rate={the area of the adhesion part (the gray-colored part in the X-ray fluoroscopic image)}/{the total area of the bonded part (the sum of the areas of the gray-colored part and the white-colored part in the X-ray fluoroscopic image)}

TABLE 2

|  | bonding rate |
| --- | --- |
| Example 1 | 98% |
| Example 2 | 95% |
| Example 3 | 97% |
| Example 4 | 91% |
| Example 5 | 94% |
| Comparative Example 1 | 77% |
| Comparative Example 2 | 61% |
| Comparative Example 3 | 65% |
| Comparative Example 5 | 66% |

According to the results of FIG. 1, in the bonded part by the gold paste of Example 1, a white-colored part generated by a space due to generation of a void was hardly observed in the appearance X-ray fluoroscopic image, and the gold powder particles were close with each other in a nearly point contact state in the cross-sectional SEM image. In addition, the bonding rate shown in Table 2 was 90% or more. Accordingly, it was confirmed that sintering of the gold powder by heating in bonding uniformly proceeded in Example 1.

When the paste of each of Examples 2 to 5 was used, the bonding rate was 90% or more according to Table 2, generation of a void was hardly observed and it was confirmed that sintering uniformly proceeded like in Example 1. Furthermore, when bonding was performed by using the silver paste, according to the appearance X-ray fluoroscopic image, generation of a void was hardly observed and it was confirmed that sintering of the silver powder uniformly proceeded.

On the other hand, when the gold paste of Comparative Example 1 was used, the bonding rate was less than 90% according to Table 2, and many white-colored parts generated by spaces due to generation of voids were observed in the appearance X-ray fluoroscopic image of FIG. 1. Thus, it is thought that when heating in bonding, many voids were generated by outgassing (emitted) derived from the organic constituent and sintering of the gold powder did not uniformly proceed in Comparative Example 1.

Moreover, when the paste of each of Comparative Examples 2, 3, and 5 was used, the bonding rate was less than 90% according to Table 2, and many white-colored parts generated by spaces due to generation of voids were observed. Furthermore, when bonding by using the gold paste of Comparative Example 7, many white-colored parts generated by spaces due to generation of voids were observed in the appearance X-ray fluoroscopic image.

Bonding Strength Test

Figure 2:
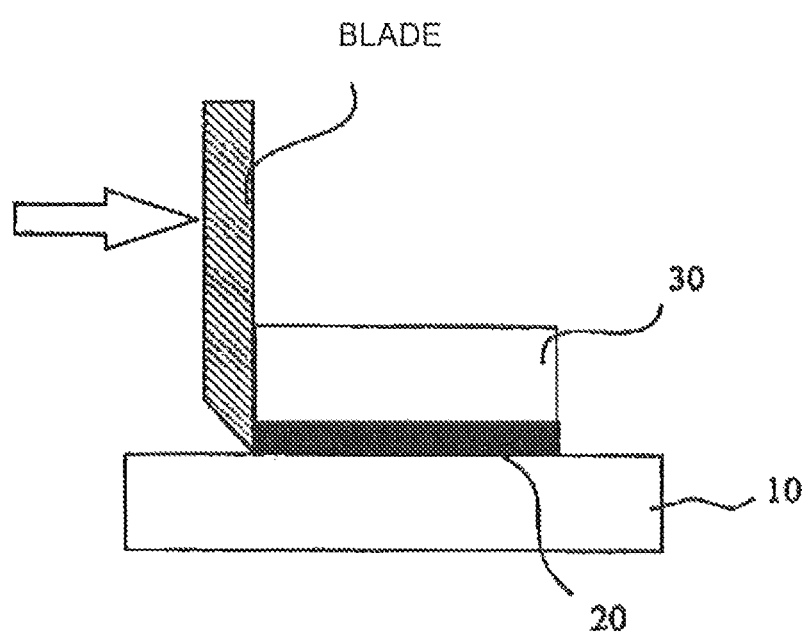
FIG. 2 shows a test method of bonding strength.

Next, with respect to the bonding performed above, a bonding strength test was performed in accordance with FIG. 2. For a semiconductor chip (heat-resistant Si chip) 30 bonded to a semiconductor substrate 10 with a sintered compact 20 sandwiched therebetween, a blade was brought into contact with the chip in the lateral direction at a constant rate and an average value of stress (unit: N) when the rupture (separation of chip) occurred was measured so that the bonding strength was obtained. An average value of bonding strength per unit area (unit: MPa) was calculated from the measurement value and the area of the bonded part after rupturing. The results are shown in Table 3.

TABLE 3

|  | rupture stress per bonded part (average value) | bonding strength (average value) |
| --- | --- | --- |
| Example 1 | 160 N | 40 MPa |
| Example 2 | 140 N | 35 MPa |
| Example 3 | 160 N | 40 MPa |
| Example 4 | 150 N | 38 MPa |
| Example 5 | 150 N | 38 MPa |
| Comparative Example 1 | 130 N | 32 MPa |

According to Table 3, when bonding by using the paste of each of Examples 1 to 5, it was confirmed that the bonded part had sufficient bonding strength (20 MPa or more) for bonding or the like of electronic components. Moreover, in bonding by using the paste of Comparative Example 1, the bonding strength similar to that of Examples was obtained. However, as described above, because the bonding rate was low (Table 2) and generation of many voids was observed (FIG. 1), the paste of Comparative Example 1 was not suitable for bonding of electronic components.

INDUSTRIAL APPLICABILITY

The precious metal paste of the present invention is suitable for low-temperature bonding of various members to be bonded, and is useful for bonding a semiconductor element and the like suspected to be influenced by thermal stress, to a substrate.

What is claimed is:

1. A precious metal paste for bonding a semiconductor element, the paste consisting essentially of either a precious metal powder and an organic solvent, or a precious metal powder, an organic solvent and surfactant, and not containing any resin, wherein the precious metal powder has a purity of 99.9 mass % or more and an average particle diameter of 0.1 to 0.5 μm, and the oranic solvent has a boiling point of 200 to 350° C., wherein the organic solvent is made of two organic solvents, which two organic solvents are a monocyclic monoterpene alcohol and a bicyclic monoterpene alcohol each having a carbon number of 5 to 20, and wherein the precious metal paste has a thixotropy index (TI) value of 6.1 or more, of a viscosity at a shear rate of 4/s with respect to a viscosity at a shear rate of 40/s at 23° C. by means of a rotational viscometer, and a viscosity at a shear rate of 4/s which is 100 to 1000 Pa·s.

2. The precious metal paste according to claim 1, wherein the precious metal powder comprises any one or more of a gold powder and a silver powder.

3. The precious metal paste according to claim 2, wherein a volume content of the precious metal powder in the precious metal paste is 26 to 66 vol. % (v/v).

4. A method of bonding which comprises die bonding a semiconductor element to a substrate with the precious metal paste of claim 3.

5. A method of bonding which comprises die bonding a semiconductor element to a substrate with the precious metal paste of claim 2.

6. The precious metal paste according to claim 2, wherein, in a bonded part when a semiconductor element is bonded, a bonding rate calculated from a ratio of an area of an adhesion part in the bonded part to a total area of the bonded part in an X-ray fluoroscopic image is 90% or more.

7. The precious metal paste according to claim 1, wherein a volume content of the precious metal powder in the precious metal paste is 26 to 66 vol. % (v/v).

8. A method of bonding which comprises die bonding a semiconductor element to a substrate with the precious metal paste of claim 7.

9. The precious metal paste according to claim 7, wherein, in a bonded part when a semiconductor element is bonded, a bonding rate calculated from a ratio of an area of an adhesion part in the bonded part to a total area of the bonded part in an X-ray fluoroscopic image is 90% or more.

10. A method of bonding which comprises die bonding a semiconductor element to a substrate with the precious metal paste of claim 1.

11. The precious metal paste according to claim 1, wherein, in a bonded part when a semiconductor element is bonded, a bonding rate calculated from a ratio of an area of an adhesion part in the bonded part to a total area of the bonded part in an X-ray fluoroscopic image is 90% or more.

* * * * *